(12) United States Patent
Du et al.

(10) Patent No.: US 9,041,448 B2
(45) Date of Patent: May 26, 2015

(54) FLIP-FLOPS IN A MONOLITHIC THREE-DIMENSIONAL (3D) INTEGRATED CIRCUIT (IC) (3DIC) AND RELATED METHODS

(71) Applicant: QUALCOMM Incorporated, San Diego, CA (US)

(72) Inventors: Yang Du, Carlsbad, CA (US); Jing Xie, University Park, PA (US); Kambiz Samadi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/784,915

(22) Filed: Mar. 5, 2013

(65) Prior Publication Data
US 2014/0253196 A1    Sep. 11, 2014

(51) Int. Cl.
| | |
|---|---|
| H03K 3/289 | (2006.01) |
| H01L 25/065 | (2006.01) |
| H01L 25/00 | (2006.01) |
| H01L 27/06 | (2006.01) |
| H03K 3/037 | (2006.01) |

(52) U.S. Cl.
CPC ............ *H01L 25/0657* (2013.01); *H01L 25/50* (2013.01); *H01L 27/0688* (2013.01); *H03K 3/0372* (2013.01); *H01L 2924/0002* (2013.01)

(58) Field of Classification Search
USPC ......... 327/199, 202, 203, 210–212, 215, 218, 327/219, 564–566
See application file for complete search history.

(56) References Cited

U.S. PATENT DOCUMENTS

| | | |
|---|---|---|
| 5,606,186 A | 2/1997 | Noda |
| 5,636,125 A | 6/1997 | Rostoker et al. |
| 5,724,557 A | 3/1998 | McBean, Sr. |

(Continued)

FOREIGN PATENT DOCUMENTS

| | | |
|---|---|---|
| EP | 1432032 A2 | 6/2004 |
| EP | 2551898 A1 | 1/2013 |

(Continued)

OTHER PUBLICATIONS

Jing Xie et al. ("CDPI: Cross-Power-Domain Interface Circuit Design in Monolithic 3D Technology", Quality Electronic Design (ISQED), 2013 14th International Symposium On, IEEE, Mar. 4, 2013, pp. 442-447).*

(Continued)

*Primary Examiner* — Long Nguyen
(74) *Attorney, Agent, or Firm* — Withrow & Terranova, PLLC

(57) ABSTRACT

Flip-flops in a monolithic three-dimensional (3D) integrated circuit (IC)(3DIC) and related method are disclosed. In one embodiment, a single clock source is provided for the 3DIC and distributed to elements within the 3DIC. Delay is provided to clock paths by selectively controllable flip-flops to help provide synchronous operation. In certain embodiments, 3D flip-flop are provided that include a master latch disposed in a first tier of a 3DIC. The master latch is configured to receive a flip-flop input and a clock input, the master latch configured to provide a master latch output. The 3D flip-flop also includes at least one slave latch disposed in at least one additional tier of the 3DIC, the at least one slave latch configured to provide a 3DIC flip-flop output. The 3D flip-flop also includes at least one monolithic intertier via (MIV) coupling the master latch output to an input of the slave latch.

20 Claims, 5 Drawing Sheets

(56) References Cited

U.S. PATENT DOCUMENTS

| | | | |
|---|---|---|---|
| 6,040,203 A | 3/2000 | Bozso et al. | |
| 6,125,217 A | 9/2000 | Paniccia et al. | |
| 6,260,182 B1 | 7/2001 | Mohan et al. | |
| 6,295,636 B1 | 9/2001 | Dupenloup | |
| 6,305,001 B1 | 10/2001 | Graef | |
| 6,374,200 B1 | 4/2002 | Nakagawa | |
| 6,448,168 B1 | 9/2002 | Rao et al. | |
| 6,627,985 B2 | 9/2003 | Huppenthal et al. | |
| 6,727,530 B1 | 4/2004 | Feng et al. | |
| 6,754,877 B1 | 6/2004 | Srinivasan | |
| 6,834,380 B2 | 12/2004 | Khazei | |
| 6,846,703 B2 | 1/2005 | Shimoda et al. | |
| 6,965,527 B2 | 11/2005 | Fasoli et al. | |
| 6,979,630 B2 | 12/2005 | Walitzki | |
| 7,107,200 B1 | 9/2006 | Korobkov | |
| 7,173,327 B2 | 2/2007 | Siniaguine | |
| 7,209,378 B2 | 4/2007 | Nejad et al. | |
| 7,280,397 B2 | 10/2007 | Scheuerlein | |
| 7,288,418 B2 | 10/2007 | Barge et al. | |
| 7,298,641 B2 | 11/2007 | Madurawe | |
| 7,356,781 B2 | 4/2008 | Koeder et al. | |
| 7,459,716 B2 | 12/2008 | Toda et al. | |
| 7,546,571 B2 | 6/2009 | Mankin et al. | |
| 7,579,654 B2 | 8/2009 | Couillard et al. | |
| 7,622,955 B2 | 11/2009 | Vilangudipitchai et al. | |
| 7,653,884 B2 | 1/2010 | Furnish et al. | |
| 7,663,620 B2 | 2/2010 | Robertson et al. | |
| 7,669,152 B1 | 2/2010 | Tcherniaev et al. | |
| 7,796,092 B2 | 9/2010 | Holly et al. | |
| 7,877,719 B2 | 1/2011 | He | |
| 7,964,916 B2 | 6/2011 | Or-Bach et al. | |
| 7,969,193 B1 | 6/2011 | Wu et al. | |
| 7,989,226 B2 | 8/2011 | Peng | |
| 8,006,212 B2 | 8/2011 | Sinha et al. | |
| 8,026,521 B1 | 9/2011 | Or-Bach et al. | |
| 8,046,727 B2 | 10/2011 | Solomon | |
| 8,059,443 B2 | 11/2011 | McLaren et al. | |
| 8,060,843 B2 | 11/2011 | Wang et al. | |
| 8,114,757 B1 | 2/2012 | Or-Bach et al. | |
| 8,115,511 B2 | 2/2012 | Or-Bach | |
| 8,136,071 B2* | 3/2012 | Solomon | 716/119 |
| 8,146,032 B2 | 3/2012 | Chen et al. | |
| 8,164,089 B2 | 4/2012 | Wu et al. | |
| 8,208,282 B2 | 6/2012 | Johnson et al. | |
| 8,218,377 B2 | 7/2012 | Tandon et al. | |
| 8,222,696 B2 | 7/2012 | Yamazaki et al. | |
| 8,230,375 B2 | 7/2012 | Madurawe | |
| 8,258,810 B2 | 9/2012 | Or-Bach et al. | |
| 8,298,875 B1 | 10/2012 | Or-Bach et al. | |
| 8,332,803 B1 | 12/2012 | Rahman | |
| 8,450,804 B2 | 5/2013 | Sekar et al. | |
| 8,576,000 B2 | 11/2013 | Kim et al. | |
| 8,683,416 B1 | 3/2014 | Trivedi et al. | |
| 8,701,073 B1 | 4/2014 | Fu et al. | |
| 8,803,206 B1 | 8/2014 | Or-Bach et al. | |
| 8,803,233 B2 | 8/2014 | Cheng et al. | |
| 2004/0036126 A1 | 2/2004 | Chau et al. | |
| 2004/0113207 A1 | 6/2004 | Hsu et al. | |
| 2004/0241958 A1 | 12/2004 | Guarini et al. | |
| 2005/0280061 A1 | 12/2005 | Lee | |
| 2006/0190889 A1 | 8/2006 | Cong et al. | |
| 2007/0040221 A1 | 2/2007 | Gossner et al. | |
| 2007/0147157 A1 | 6/2007 | Luo et al. | |
| 2007/0244976 A1 | 10/2007 | Shang et al. | |
| 2008/0276212 A1 | 11/2008 | Albrecht et al. | |
| 2008/0283995 A1 | 11/2008 | Bucki et al. | |
| 2008/0291767 A1 | 11/2008 | Barnes et al. | |
| 2009/0174032 A1 | 7/2009 | Maejima et al. | |
| 2009/0302394 A1 | 12/2009 | Fujita | |
| 2010/0115477 A1 | 5/2010 | Albrecht et al. | |
| 2010/0140790 A1 | 6/2010 | Setiadi et al. | |
| 2010/0193770 A1 | 8/2010 | Bangsaruntip et al. | |
| 2010/0229142 A1 | 9/2010 | Masleid et al. | |
| 2010/0276662 A1 | 11/2010 | Colinge | |
| 2011/0049594 A1 | 3/2011 | Dyer et al. | |
| 2011/0053332 A1 | 3/2011 | Lee | |
| 2011/0059599 A1 | 3/2011 | Ward et al. | |
| 2011/0078222 A1 | 3/2011 | Wegener | |
| 2011/0084314 A1 | 4/2011 | Or-Bach et al. | |
| 2011/0121366 A1 | 5/2011 | Or-Bach et al. | |
| 2011/0215300 A1 | 9/2011 | Guo et al. | |
| 2011/0221502 A1 | 9/2011 | Meijer et al. | |
| 2011/0222332 A1 | 9/2011 | Liaw et al. | |
| 2011/0253982 A1 | 10/2011 | Wang et al. | |
| 2011/0272788 A1* | 11/2011 | Kim et al. | 257/618 |
| 2011/0280076 A1 | 11/2011 | Samachisa et al. | |
| 2011/0298021 A1 | 12/2011 | Tada et al. | |
| 2012/0012972 A1 | 1/2012 | Takafuji et al. | |
| 2012/0056258 A1 | 3/2012 | Chen | |
| 2012/0129276 A1 | 5/2012 | Haensch et al. | |
| 2012/0129301 A1 | 5/2012 | Or-Bach et al. | |
| 2012/0152322 A1 | 6/2012 | Kribus et al. | |
| 2012/0171108 A1 | 7/2012 | Kim et al. | |
| 2012/0181508 A1 | 7/2012 | Chang et al. | |
| 2012/0187486 A1 | 7/2012 | Goto et al. | |
| 2012/0193621 A1 | 8/2012 | Or-Bach et al. | |
| 2012/0195136 A1 | 8/2012 | Yoko | |
| 2012/0217479 A1 | 8/2012 | Chang et al. | |
| 2012/0280231 A1 | 11/2012 | Ito et al. | |
| 2012/0286822 A1 | 11/2012 | Madurawe | |
| 2012/0304142 A1 | 11/2012 | Morimoto et al. | |
| 2012/0305893 A1 | 12/2012 | Colinge | |
| 2012/0313227 A1 | 12/2012 | Or-Bach et al. | |
| 2013/0026539 A1 | 1/2013 | Tang et al. | |
| 2013/0026608 A1 | 1/2013 | Radu | |
| 2013/0105897 A1 | 5/2013 | Bangsaruntip et al. | |
| 2013/0148402 A1* | 6/2013 | Chang et al. | 365/63 |
| 2013/0240828 A1 | 9/2013 | Ota et al. | |
| 2013/0299771 A1 | 11/2013 | Youn et al. | |
| 2014/0008606 A1 | 1/2014 | Hussain et al. | |
| 2014/0035041 A1 | 2/2014 | Pillarisetty et al. | |
| 2014/0085959 A1 | 3/2014 | Saraswat et al. | |
| 2014/0097868 A1 | 4/2014 | Ngai | |
| 2014/0225218 A1 | 8/2014 | Du | |
| 2014/0225235 A1 | 8/2014 | Du | |
| 2014/0269022 A1 | 9/2014 | Xie et al. | |

FOREIGN PATENT DOCUMENTS

| | | |
|---|---|---|
| FR | 2973938 A1 | 10/2012 |
| JP | H06204810 A | 7/1994 |
| JP | 2001160612 A | 6/2001 |
| KR | 20010109790 A | 12/2001 |
| KR | 20080038535 A | 5/2008 |
| WO | 2011112300 A1 | 9/2011 |
| WO | 2012113898 A1 | 8/2012 |
| WO | 2013045985 A1 | 4/2013 |

OTHER PUBLICATIONS

Gong., et al., "Three Dimensional System Integration", Springer, IC Stacking Process and Design, Jan. 2011; IS8N 978-1-4419-0962-6; pp. 1-246.

Co-pending U.S. Appl. No. 13/788,224, filed Mar. 7, 2013.

Co-pending U.S. Appl. No. 13/792,384, filed Mar. 11, 2013.

Co-pending U.S. Appl. No. 13/792,486, filed Mar. 11, 2013.

Co-pending U.S. Appl. No. 13/792,592, filed Mar. 11, 2013.

Fujio I. et al., "Level Conversion for Dual-Supply Systems", IEEE Transactions on Very Large Scale Integration (VLSI) Systems, vol. 12, No. 2, Feb. 2004, pp. 185-195.

Mototsugu H. et al., "A Top-Down Low Power Design Technique Using Clustered Voltage Scaling with Variable Supply-Voltage Scheme", IEEE 1998 Custom Integrated Circuits Conference, pp. 495-498.

Arunachalam V., et al., "Low-power clock distribution in microprocessor", Proceedings of the 18th ACM Great Lakes Symposium on VLSI , GLSVLSI '08, Jan. 1, 2008, 3 pages, XP055106715, New York, USA DOI: 10.1145/1366110.1366212 ISBN: 978-1-59-593999-9 p. 429-p. 434.

Donno M., et al., "Power-aware clock tree planning", Proceedings of the 2004 International Symposium on Physical Design, ISPD '04,

(56) References Cited

OTHER PUBLICATIONS

Jan. 1, 2004, 5 pages, XP055106989, New York, New York, USA DOI: 10.11451981066.981097 ISBN: 978-1-58-113817-7 p. 140-p. 144.

Ganguly S., et al., "Clock distribution design and verification for PowerPC microprocessors", Computer-Aided Design, 1997, Digest of Technical Papers., 1997 IEEE/AC M International Conference on San Jose, CA, USA Nov. 9-13, 1997, Los Alamitos, CA, USA, IEEE Comput. Soc, US, Nov. 5, 1995, pp. 58-61, XP032372227, DOI: 10.1109/ICCAD.1995.479991 ISBN: 978-0-8186-8200-1 p. 58-p. 61.

International Search Report and Written Opinion—PCT/US2014/018963—ISA/EPO—May 13, 2014.

Tsao C.W.A., et al., "UST/DME: a clock tree router for general skew constraints", Computer Aided Design, 2000, ICCAD-2000, IEEE/ACM International Conference on, IEEE, Nov. 5, 2000, pp. 400-405, XP032402965, DOI: 10.1109/ICCAD.2000.896505 ISBN: 978-0-7803-6445-5 p. 400-p. 401.

Xie J., et al., "CPDI: Cross-power-domain interface circuit design in monolithic 3D technology", Quality Electronic Design (ISQED), 2013 14th International Symposium ON, IEEE, Mar. 4, 2013, pp. 442-447, XP032418452, DOI: 10.1109/ISQED.2013.6523649 ISBN: 978-1-4673-4951-2 Section II. "Monolithic 3D Technology"; figures 1,3.

Cong J. et al., "An Automated Design Flow for 3D Microarchitecture Evaluation," 11th Asia and South Pacific Design Automation Conference, Jan. 24, 2006, IEEE, pp. 384-389.

Friedman, E. G., "Clock Distribution Networks in Synchronous Digital Integrated Circuits," Proceedings of the IEEE, vol. 89, No. 5, May 2001, IEEE, pp. 665-692.

Jain A. et al., "Thermal-electrical co-optimisation of floorplanning of three-dimensional integrated circuits under manufacturing and physical design constraints," IET Computers and Digital Techniques, vol. 5, No. 3, May 2011, IET, pp. 169-178.

Khan Q.A., et al., "A Single Supply Level Shifter for Multi-Voltage Systems," IEEE Proceedings of the 19th International Conference on VLSI Design (VLSID'06), Jan. 2006, IEEE, 4 pages.

Kim, T-Y., et al., "Clock Tree Synthesis for TSV-Based 3D IC designs," ACM Transactions on Design Automation of Electronic Systems, vol. 16, No. 4, Article 48, Oct. 2011, ACM, pp. 48:1-48:21.

Kulkarni J., et al., "Capacitive-Coupling Wordline Boosting with Self-Induced VCC Collapse for Write VMIN Reduction in 22-nm 8T SRAM," IEEE International Solid-State Circuits Conference, Feb. 2012, IEEE, pp. 234-236.

Lin, C-T., et al., "CAD Reference Flow for 3D Via-Last Integrated Circuits," 15th Asia and South Pacific Design Automation Conference (ASP-DAC), Jan. 2010, IEEE, pp. 187-192.

Lin S., et al., "A New Family of Sequential Elements with Built-in Soft Error Tolerance for Dual-VDD Systems," IEEE Transactions on Very Large Scale Integration (VLSI) Systems, vol. 16, No. 10, Oct. 2008, IEEE, pp. 1372-1384.

Loh, Gabriel H. et al., "Processor Design in 3D Die-Stacking Technologies," IEEE MICRO, vol. 27, No. 3, May-Jun. 2007, IEEE, pp. 31-48.

Minz J. et al., "Block-Level 3-D Global Routing With an Application to 3-D Packaging", IEEE Transactions on Computer-Aided Design of Integrated Circuits and Systems, vol. 25, No. 10, Oct. 2006, IEEE, pp. 2248-2257.

Minz, J. et al., "Channel and Pin Assignment for Three Dimensional Packaging Routing," May 24, 2004, http://www.ceres.gatech.edu/tech-reports/tr2004/git-cercs-04-21.pdf, 6 pages.

Bobba, S., et al., "Performance Analysis of 3-D Monolithic Integrated Circuits," 2010 IEEE International 3D Systems Integration Conference (3DIC), Nov. 16-18, 2010, Munich, Germany, IEEE, 4 pages.

\* cited by examiner

US 9,041,448 B2

FLIP-FLOPS IN A MONOLITHIC THREE-DIMENSIONAL (3D) INTEGRATED CIRCUIT (IC) (3DIC) AND RELATED METHODS

RELATED APPLICATIONS

The present application is related to U.S. patent application Ser. No. 13/765,080 filed on Feb. 12, 2013 and entitled "ION REDUCED, ION CUT-FORMED THREE-DIMENSIONAL (3D) INTEGRATED CIRCUIT'S (IC) (3DICs), AND RELATED METHODS AND SYSTEMS," which is incorporated herein by references in its entirety.

The present application is also related to U.S. patent application Ser. No. 13/765,061 tiled on Feb. 12, 2013 and entitled "THREE DIMENSIONAL (3D) INTEGRATED CIRCUITS (3DICs) WITH GRAPHENE SHIELD, AND RELATED COMPONENTS AND METHODS," which is incorporated herein by reference in its entirety.

BACKGROUND

I. Field of the Disclosure

The technology of the disclosure relates generally to monolithic three-dimensional (3D) integrated circuits (IC) (3DICs) and components therewithin.

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. These and other factors contribute to a continued miniaturization of components and power consumption within the circuitry. Miniaturization of the components impacts all aspects of the processing circuitry including the transistors and other reactive elements in the processing circuitry. One miniaturization technique involves arranging integrated circuits in not just an x-y coordinate system, but also in a z-coordinate system. That is, current miniaturization techniques use three-dimensional (3D) integrated circuits (ICs) (3DICs) to achieve higher device packing density, lower interconnect delay, and lower costs. Currently, there are several techniques to manufacture or form 3DICs.

While miniaturization has received copious attention in the realm of circuit design, other designers remain focused on clock signals within the circuits. The clock signals may control or synchronize myriad operations of components within the circuit. When considering synchronization issues, the time of arrival of the clock signal becomes important. The longer the electrical path between the clock source and the destination, the longer it takes for the clock signal to arrive. This time delay is further impacted by the resistance-capacitance (RC) factor of the electrical conductor. The higher the resistance, the slower the clock signal travels.

When clock signals are used in 3DICs, there are currently two contemplated ways to route clock signals within the 3DIC. In a first solution, a single clock is used and passed to all layers of the 3DIC through one or more through silicon vias (TSVs). TSVs generally have a relatively high capacitance and a correspondingly high RC factor. The RC factor significantly slows the clock signal and produces unacceptably high clock skew (i.e., the difference in the arrival time between two sequentially—adjacent registers or components within the circuit) and induces unacceptable power consumption. Further, using additional TSVs and clock buffers to contain the clock skew imposes an unacceptable area penalty. In a second solution, separate clocks are provided on different levels of the 3DIC. The use of separate clocks forces the circuit to operate asynchronously because the circuit design cannot guarantee that the clocks operate synchronously. While many circuits are capable of functional behavior with asynchronous control, many communication circuits require synchronous operation. In addition, each clock tree may be responsible for consuming approximately thirty-forty percent (30-40%) of the total power consumption in a typical digital logic circuit and thus, multiple clocks are not a viable solution for many low power circuit designs.

The advent of monolithic 3DIC technology has replaced the TSV with monolithic intertier vias (MIVs) which have substantially lower RC factors. The existence of MIAs allows a monolithic 3DIC to operate synchronously, but the challenge remains to make sure that the clock skew between components is relatively small.

SUMMARY OF THE DISCLOSURE

Embodiments disclosed in the detailed description include flip-flops in a monolithic three-dimensional (3D) integrated circuit (IC) (3DIC) and related methods. A single clock source is provided for the 3DIC and distributed to elements on various differing tiers within the 3DIC. Delay is provided to clock paths by selectively controllable flip-flops to help provide synchronous operation. The flip-flops are spread across the tiers of the 3DIC such that part of the flip-flop is on a first tier and a second part of the flip-flop is on a second tier.

In this regard in one embodiment, a 3D flip-flop is disclosed. The 3D flip-flop comprises a master latch disposed in a first tier of a 3DIC, the master latch configured to receive a flip-flop input and provide a master latch output and a clock input. The 3D flip-flop also comprises at least one slave latch disposed in at least one additional tier of the 3DIC, the at least one slave latch configured to provide a 3DIC flip-flop output. The 3D flip-flop also comprises at least one monolithic intertier via (MW) coupling an output of the master latch to an input of the at least one slave latch.

In another embodiment, a 3D flip-flop is disclosed. The 3D flip-flop comprises a clocked master means for latching disposed in a first tier of a 3DIC, the clocked master means for latching configured to receive a flip-flop input and provide a master latch output and a clock input. The 3D flip-flop also comprises at least one clocked slave means for latching disposed in at least one additional tier of the 3DIC, the at least one clocked slave means for latching configured to provide a 3DIC flip-flop output. The 3D flip-flop also comprises at least one MIV coupling an output of the master latch to an input of the at least one slave latch.

In another embodiment, a method of forming a 3DIC is disclosed. The method comprises providing a master latch on a first tier of the 3DIC. The method also comprises providing a slave clocked latch on a second tier of the 3DIC wherein the second tier is different from the first tier. The method also comprises coupling the master latch to the slave clocked latch with at least one MW.

DETAILED DESCRIPTION

Figure 1:
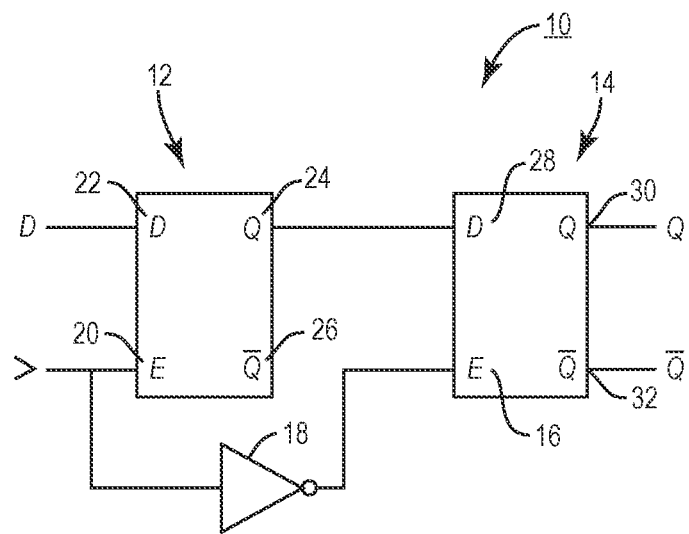
FIG. 1 is a block diagram of an exemplary conventional master-slave flip-flop.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include flip-flops in a monolithic three-dimensional (3D) integrated circuit (IC) (3DIC) and related methods. A single clock source is provided for the 3DIC and distributed to elements within the 3DIC. Delay is provided to clock paths by selectively controllable flip-flops to help provide synchronous operation. The flip-flops are spread across the tiers of the 3DIC such that part of the flip-flop is on a first tier and a second part of the flip-flop is on a second tier.

Figure 2A:
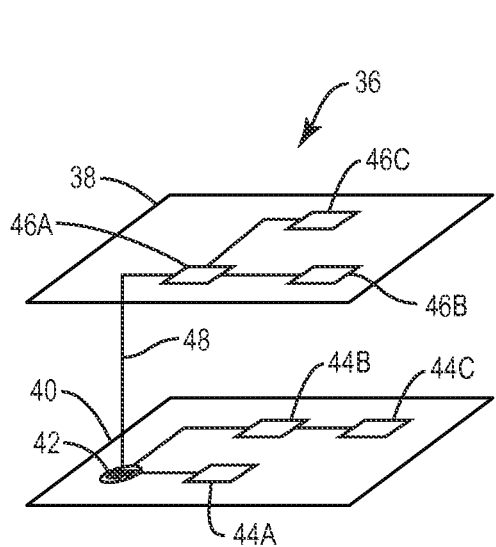
FIG. 2A is a block diagram of a three-dimensional (3D) integrated circuit (IC) (3DIC) with a single synchronous clock signal.
Figure 2B:
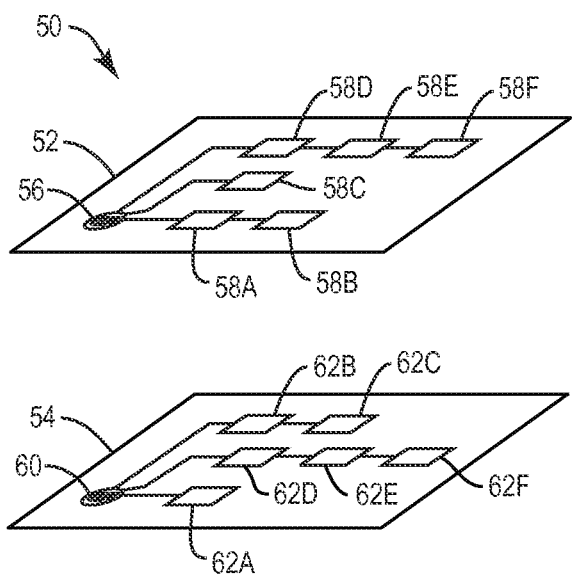
FIG. 2B is a block diagram of a conventional 3DIC with asynchronous clock signals.

Before addressing the 3D flip-flop of the present disclosure, a brief overview of conventional flip-flops is provided with reference to FIGS. 1-2B. A discussion of the 3D flip-flops of the present disclosure begins below with reference to FIG. 3.

In this regard, FIG. 1 is a block diagram of a conventional flip-flop 10 which is a master-slave flip-flop formed from connecting a first master gated D latch 12 to a second slave gated D latch 14 in series and inserting the enable ("E") input 16 with an inverter 18. It is called a master-slave flip-flop because the second latch (i.e., second slave gated D latch 14) in the series only changes in response to a change in the first latch (i.e., first master gated D latch 12). The first master gated D latch 12 includes an enable input 20 that receives a signal from a clock (not shown) and D input 22, and outputs 24, 26. The output 24 is coupled to a D input 28 of the second slave gated D latch 14. The second slave gated D latch 14 also includes outputs 30, 32 as is well understood.

Many integrated circuits rely on a clock signal for various reasons. Clock signals are typically generated by a crystal oscillator and then routed to each component as needed. Routing to each component is done through conductive elements which have a resistance (R) and may have a capacitance (C). Together, the resistance and capacitance (RC) introduce a delay in the signal that is a function of the distance the signal has to travel. Elements that are closer to the clock receive their clock signal sooner than elements that are further away from the clock. The difference in the arrival time between two elements is referred to as clock skew. While some integrated circuits may tolerate a relatively large clock skew, other circuits are sensitive to clock skew and do not operate properly if the clock skew exceeds certain thresholds. One way to reduce clock skew is to introduce delay into the shorter conductive elements such that each conductive element has approximately the same delay. One way to introduce delay is through the use of a master-slave flip-flop, such as flip-flop 10.

While the use of master-slave flip-flops has proven effective in two-dimensional ICs, the problems with clock skew are greater in a 3DIC. Specifically, conventional 3DICs use through silicon vias (TSVs) to connect different tiers of components within the 3DIC. TSVs have a relatively high RC component and introduce substantial delay into the signals that pass between tiers. If this signal is a clock signal, the clock skew is correspondingly impacted negatively. Putting a flip-flop on every tier of the 3DIC consumes too much area within the 3DIC.

When allocating space within a 3DIC, some circuit designers rely on automated computer aided design software (CAD) for laying out the precise positions of elements within an integrated circuit. Such CAD software balances various design criteria and plots out the positions of the various components within the IC as well as the conductive elements that interconnect the various components. Even with the assistance of these CAD programs, circuit designers have not been able to reduce the amount of area consumed by flip-flops in each tier of the 3DIC. Thus, there remains a concern about how best to implement flip-flops in a 3DIC.

In this regard, FIG. 2A illustrates an exemplary related 3DIC 36 with a first tier 38 and a second tier 40 that are positioned one above the other. A clock 42 is positioned on the second tier 40 and provides a clock signal to components 44A-44C in the second tier 40 and components 46A-46C in the first tier 38. The first tier 38 is coupled to the second tier 40 through one or more TSVs 48 (only one shown). The clock signal from the clock 42 is substantially delayed by passage through the TSV 48 and accordingly, the clock skew between component 44A (closest to the clock 42) and 46B (furthest away from the clock 42) is relatively large. Thus, the use of a single clock over a 3DIC such as 3DIC 36 forces long connections from the clock 42 to the element needing to be synched to the clock. The longer the connection, the larger the RC delay, and the wider distribution of the delay among the various elements. Flip-flops can be used to introduce delay, but the more delay that is required to provide the desired synchronization, the more delay buffers are needed, which increase power consumption and use area within the 3DIC 36. Further, the distribution of the delay causes a performance degradation to tolerate the random variation of clock skews.

One solution to the clock skew that exists in the 3DIC 36 is to provide separate clock signals for each tier of the 3DIC. An exemplary embodiment of such solution is illustrated in FIG. 2B and 3DIC 50, The 3DIC SO includes a first tier 52 and a second tier 54, The first tier 52 includes a first clock 56 and components 58A-58F arranged in a clock tree as is well understood. The second tier 54 includes a second clock 60 and components 62A-62F arranged in a second clock tree as is well understood. The 3DIC 50 has an asynchronous clock as between the first tier 52, and the second tier 54 because it is not possible to guarantee that the first clock 56 is synchronized with the second clock 60. There may be many applications that meet design criteria with asynchronous clock signals. Unfortunately, there are many cellular applications which require synchronous clock signals, which, as explained above, have problems with clock skew.

One of the relatively recent advances in 3DIC design is the advent of monolithic 3DICs with a monolithic intertier via. (MW) which has a substantially smaller size and lower RC value compared to TSVs. The existence of such monolithic 3DICs allows for new design options. In particular, the lower RC value means that there is less delay in passing signals from one tier of the 3DIC to a different tier of the 3DIC. It should be appreciated that the 3DIC of the previously incorporated '080 application may be a monolithic 3DIC and embodiments of the present disclosure may be formed in 3DICs formed through the processes disclosed in the '080 application. Furthermore, the shielding concepts of the previously incorporated '061 application may also be implemented in embodiments of the present disclosure without departing from the present disclosure.

In this regard, one exemplary design option for providing a flip-flop in an 3DIC is the splitting of a flip-flop across multiple tiers. A simplified block diagram of an exemplary 3D flip-flop 70 is provided in FIG. 3. In this embodiment, the 3D flip-flop 70 includes a master latch 72 and a slave latch 74 coupled in series with an inverter 76. The master latch 72 is sometimes referred to as a master means for latching. The slave latch 74 is sometimes referred to as a slave means for latching. A clock 78 provides a clock signal to the 3D flip-flop 70. The clock 78 is sometimes referred to as a clocking means. The master latch 72 is positioned on a first tier 80, and the slave latch 74 is positioned on a second tier 82. The master latch 72 is electrically coupled to the slave latch 74 through one or more MIVs 84. In an exemplary embodiment, two MIVs 84 are used, one for the clock signal and one for the data signal. However, the disclosure may be implemented with just one MIV 84 coupled with another via (e.g., TSV) or other form of intertier connection. As noted above, the MIV 84 is a relatively low RC value interconnect between the different tiers of the 3DIC and allows for a relatively low RC induced delay for the signals that pass from the master latch 72 to the slave latch 74 as well as the signal 86 from the inverter 76 to the slave latch 74. The smaller size of the MIV 84 (relative to a TSV) and lower RC induced delay makes it more practical to provide a synchronous clock signal across all the tiers of the 3DIC with the 3D flip-flop providing desired delay for the various components. Furthermore, as will be discussed in more detail below, variations in the materials used for the tiers allows parameters of the 3D flip-flop to be varied to meet various design requirements or goals.

Figure 4:
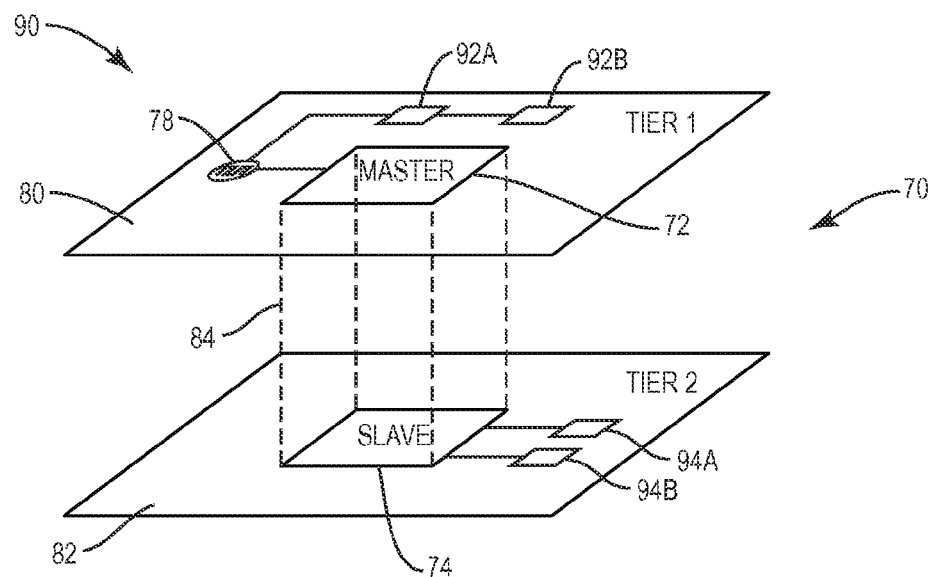
FIG. 4 is a pseudo-perspective block diagram of an exemplary two tier 3DIC with a 3D flip-flop.

The 3D flip-flop 70 is shown in a monolithic 3DIC 90 in a pseudo-perspective block diagram in FIG. 4. The master latch 72 is positioned on the first tier 80 with the clock 78 and additional components 92A, 92B. The slave latch 74 is positioned on the second tier 82 with additional components 94A, 94B. The master latch 72 is electrically coupled to the slave latch through the MIV 84. The 3D flip-flop 70 provides desired delay to components in the 3DIC and preserves area within the 3DIC 90.

Figure 5:
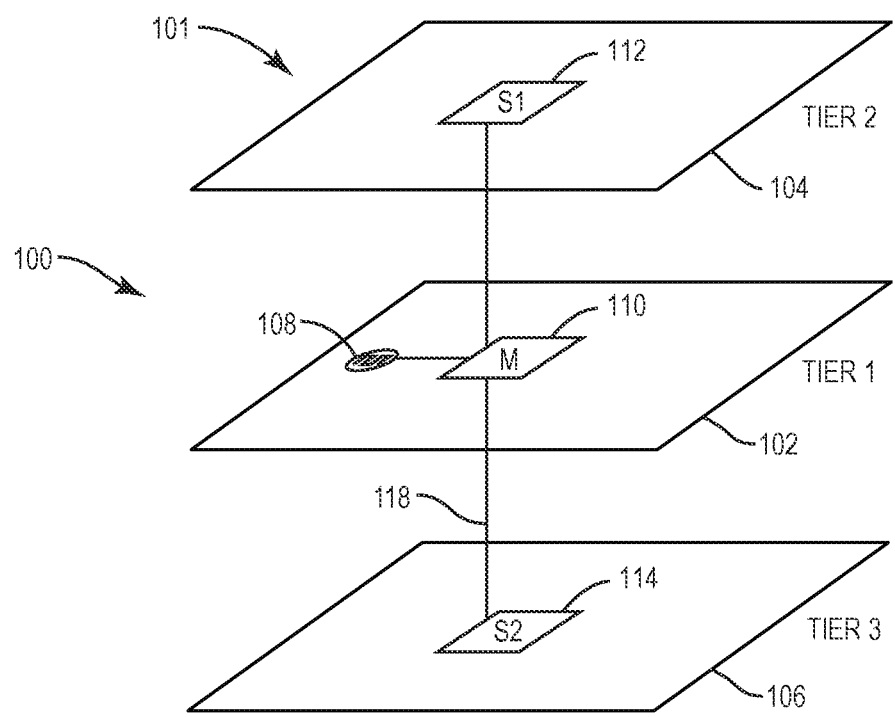
FIG. 5 is a pseudo-perspective block diagram of an exemplary three tier 3DIC with a 3D flip-flop.

There may be occasions when there are more than two tiers in a 3DIC. An exemplary embodiment of a three tier 3DIC 100 is illustrated in FIG. 5. It should be appreciated that while the present disclosure has illustrated two and three tier 3DICs 90, 100, 3DICs with more tiers may also be fabricated according to the methods presented herein. The 3DIC 100 includes a first tier 102, a second tier 104 and a third tier 106 across all three of which a 3D flip-flop 101 is positioned. The first tier 102 includes a clock 108 and a master latch 110. The second tier 104 includes a first slave latch 112. The third tier 106 includes a second slave latch 114. Additional components may be present on any of the tiers 102, 104, 106. The tiers 102, 104, 106 are interconnected with MTV 116, 118.

One exemplary benefit of splitting the 3D flip-flop 70, 101 across multiple tiers is that the electric speed of a particular tier can be varied relative to the others. Such variation may be introduced by changing the material (e.g., nMOS or pMOS) used to form the tier or changing other material properties (including conductive element dimensions) of the tiers. Thus, for example, the tier 80, 102 on which the master latch 72, 110 is positioned may be electrically faster than a tier 82, 104, 106 on which a slave latch 74, 112, 114 is positioned. Alternatively, the tier 80, 102 on which the master latch 72, 110 is positioned may be electrically slower than a tier 82, 104, 106 on which a slave latch 74, 112, 114 is positioned. In still another embodiment, the tier 102 on which the master latch 110 is positioned may be electrically faster than the second tier 104 but electrically slower than the third tier 106. Manipulation of the relative electrical speeds allows for increased options in controlling the delay introduced by the 3D flip-flop 70, 101.

Note that an additional advantage of splitting the 3D flip-flop 70, 101 into different tiers 80, 82, 102, 104, 106 is the conservation of space within the 3DIC 90, 100. That is, under conventional approaches, a full flip-flop would have to be allocated for each tier. Using the concepts of the present disclosure, a single master latch 72, 110 is used saving the space on each of the secondary tiers 82, 104, 106 for other components.

Against the backdrop of the hardware of FIGS. 4 and 5, a method of forming a 3DIC 90, 100 with a 3D flip-flop 70, 101 is discussed with reference to FIG. 6. Initially, a basic 3DIC 90, 100 is designed (block 120). Such design may include selecting a purpose for the 3DIC 90, 100, determining how many tiers will be used, what elements are needed for what purposes, and the like. In an exemplary embodiment, the circuit designer may use CAD software in laying out the elements within the 3DIC 90, 100. Such CAD software may receive as inputs each of the elements needed and purposes as well as other design criteria and then provide a layout of where within the 3DIC 90, 100 each element is positioned. Many such CAD software packages allow designers to create custom hard macro-commands ("hard macro"), which take the decision making out of the intelligence of the software for particular elements. In an exemplary embodiment, a 3D flip-flop 70, 101 may be embodied in the CAD software as such a hard macro. That is, a designer may pre-program the master latch, slave latch, MIV connection and the like as a module which is then "plugged" into the circuit design. The CAD software accepts the placement of the 3D flip-flop module and makes circuit layout decisions for the remainder of the 3DIC 90, 100 without changing the placement and interconnections of the 3D flip-flop elements. In another exemplary embodiment, the 3D flip-flops 70, 101 may be programmed in the CAD software as a soft macro which allows greater flexibility in the placement of elements so long as the master-slave signal and clock links are paired properly.

Figure 6:
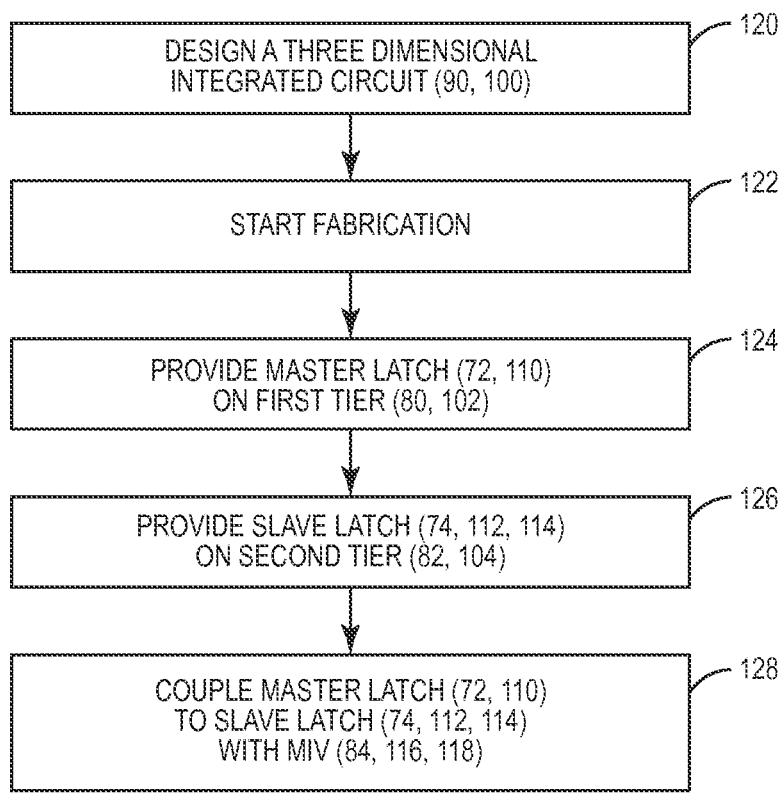
FIG. 6 is a flow chart of the method of designing and forming a 3DIC with a 3D flip-flop.

With continuing reference to FIG. 6, the process continues with the start of fabrication of a 3DIC 90, 100 according to the previously designed circuitry (block 122). During fabrication, a master latch 72, 110 is provided on a first tier 80, 102 (block 124). A slave latch 74, 112, 114 is provided on a second (and third) tier 82, 104, 106 (block 126) with the master latch 72, 110 coupled to the slave latch 74, 112, 114 with MIV 84, 116, 118 (block 128).

The 3D flip-flops 70, 101 according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 3:
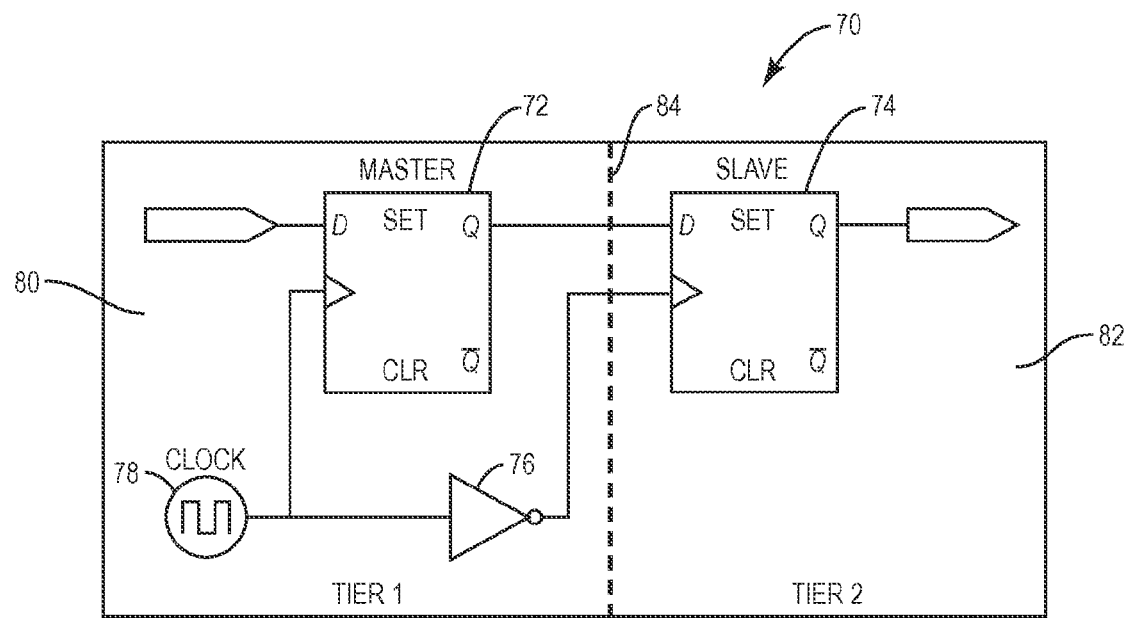
FIG. 3 is a block diagram of an exemplary two tier 3DIC with a 3D flip-flop in two dimensions.
Figure 7:
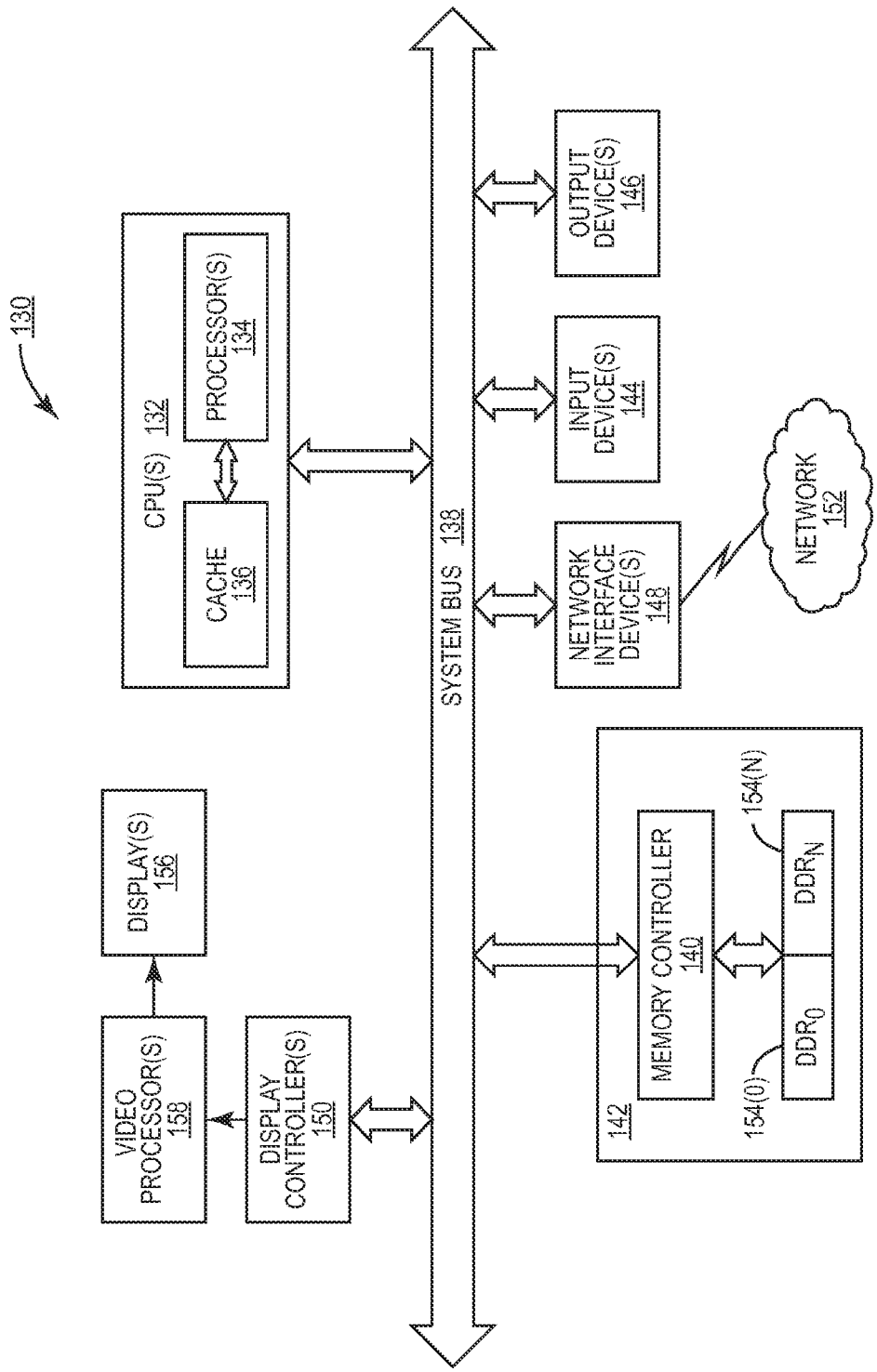
FIG. 7 is a block diagram of an exemplary processor-based system that can include the 3D flip-flops of FIG. 4 or 5.

In this regard, FIG. 7 illustrates an example of a processor-based system 130 that can employ the 3D flip-flops 70, 101 illustrated in FIGS. 3-5. In this example, the processor-based system 130 includes one or more central processing units (CPUs) 132, each including one or more processors 134. The CPU(s) 132 may have cache memory 136 coupled to the processor(s) 134 for rapid access to temporarily stored data. The CPU(s) 132 is coupled to a system bus 138 and can intercouple master devices and slave devices included in the processor-based system 130. As is well known, the CPU(s) 132 communicates with these other devices by exchanging address, control, and data information over the system bus 138. For example, the CPU(s) 132 can communicate bus transaction requests to the memory controller 140.

Other master and slave devices can be connected to the system bus 138. As illustrated in FIG. 7, these devices can include a memory system 142, one or more input devices 144, one or more output devices 146, one or more network interface devices 148, and one or more display controllers 150, as examples. The input device(s) 144 can include any type of input device, including but not limited to input keys, switches, voice processors, etc. The output device(s) 146 can include any type of output device, including but not limited to audio, video, other visual indicators, etc. The network interface device(s) 148 can be any devices configured to allow exchange of data to and from a network 152. The network 152 can be any type of network, including but not limited to a wired or wireless network, private or public network, a local area network (LAN), a wide local area network (WLAN), and the Internet. The network interface device(s) 148 can be configured to support any type of communication protocol desired. The memory system 142 can include one or more memory units 154(0-N).

The CPU(s) 132 may also be configured to access the display controller(s) 150 over the system bus 138 to control information sent to one or more displays 156. The display controller(s) 150 sends information to the display(s) 156 to be displayed via one or more video processors 158, which process the information to be displayed into a format suitable for the display(s) 156. The display(s) 156 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor, The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art, Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three-dimensional (3D) flip-flop, comprising:
   a master latch disposed in a first tier of a 3D integrated circuit (IC) (3DIC), the master latch configured to receive a flip-flop input and a clock input, the master latch configured to provide a master latch output;
   at least one slave latch disposed in at least one additional tier of the 3DIC, the at least one slave latch configured to provide a 3DIC flip-flop output; and
   at least one monolithic intertier via (MIV) coupling the master latch output to an input of the at least one slave latch.

2. The 3D flip-flop of claim 1, wherein the at least one slave latch comprises a plurality of slave latches.

3. The 3D flip-flop of claim 2, wherein a first of the plurality of slave latches is on the at least one additional tier of the 3DIC and a second of the plurality of slave latches is on a second additional tier of the 3DIC.

4. The 3D flip-flop of claim 1, further comprising a clock source configured to provide the clock input and to provide an input to an enable input on the at least one slave latch.

5. The 3D flip-flop of claim 1, wherein the first tier comprises a material that is electrically faster than a material forming the at least one additional tier.

6. The 3D flip-flop of claim 1, wherein the first tier comprises a material that is electrically slower than a material forming the at least one additional tier.

7. The 3D flip-flop of claim 1 integrated into a semiconductor die.

8. The 3D flip-flop of claim 1 integrated into a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the 3D flip-flop is integrated.

9. A three-dimensional (3D) flip-flop, comprising:
a master means for latching disposed in a first tier of a 3D integrated circuit (IC) (3DIC), the master means for latching configured to receive a flip-flop input and a clock input and the master means configured to provide a master latch output;
at least one slave means for latching disposed in at least one additional tier of the 3DIC, the at least one slave means for latching configured to provide a 3DIC flip-flop output; and
at least one monolithic intertier via (MIV) coupling the master latch output to an input of the at least one slave means.

10. The 3D flip-flop of claim 9, wherein the at least one slave means for latching comprises a plurality of slave latches.

11. The 3D flip-flop of claim 10, wherein a first of the plurality of slave latches is on the at least one additional tier of the 3DIC and a second of the plurality of slave latches is on a second additional tier of the 3DIC.

12. The 3D flip-flop of claim 9, further comprising a means for clocking configured to provide the clock input and to provide an input to an enable input on the at least one slave means.

13. The 3D flip-flop of claim 9, wherein the first tier comprises a material that is electrically faster than a material forming the at least one additional tier.

14. The 3D flip-flop of claim 9, wherein the first tier comprises a material that is electrically slower than a material forming the at least one additional tier.

15. A method of forming a three-dimensional (3D) integrated circuit (IC) (3DIC), comprising:
providing a master latch on a first tier of the 3DIC;
providing a slave latch on a second tier of the 3DIC wherein the second tier is different from the first tier; and
coupling the master latch to the slave latch with at least one monolithic intertier via (MIV).

16. The method of claim 15, wherein coupling the master latch to the slave latch comprises coupling a master latch output to the at least one MIV.

17. The method of claim 15, further comprising positioning the master latch and the slave latch as a hard macro during the a design phase.

18. The method of claim 15, wherein coupling the master latch to the slave latch comprises coupling an input of the slave latch to the at least one MIV.

19. The method of claim 15, further comprising providing a flip-flop output for the slave latch.

20. The method of claim 15, further comprising forming the first tier from a material that is electrically faster than a material used to form the second tier.

* * * * *